US009542084B1

(12) United States Patent
Colancon et al.

(10) Patent No.: US 9,542,084 B1
(45) Date of Patent: Jan. 10, 2017

(54) SYSTEM AND METHOD FOR GENERATING VIAS IN AN ELECTRONIC DESIGN BY AUTOMATICALLY USING A HOVERING CURSOR INDICATION

(71) Applicant: Cadence Design Systems, Inc., San Jose, CA (US)

(72) Inventors: Stephane Colancon, Grasse (FR); Gerard Tarroux, Villeneuve-Loubet (FR); Mark Nitters, Le Rouret (FR); Fabien Campana, Les Adrets de L'Esterel (FR)

(73) Assignee: Cadence Design Systems, Inc., San Jose, CA (US)

( * ) Notice: Subject to any disclaimer, the term of this patent is extended or adjusted under 35 U.S.C. 154(b) by 44 days.

(21) Appl. No.: 14/601,747

(22) Filed: Jan. 21, 2015

(51) Int. Cl.
| | |
|---|---|
| G06F 17/50 | (2006.01) |
| G06F 3/0484 | (2013.01) |
| G06F 3/0481 | (2013.01) |
| G06F 3/0482 | (2013.01) |

(52) U.S. Cl.
CPC ......... *G06F 3/04842* (2013.01); *G06F 3/0482* (2013.01); *G06F 3/04817* (2013.01); *G06F 17/5068* (2013.01)

(58) Field of Classification Search
CPC .................................................. G06F 17/5068
USPC ....................................................... 716/139
See application file for complete search history.

(56) References Cited

U.S. PATENT DOCUMENTS

| | | | | |
|---|---|---|---|---|
| 8,086,991 | B1 * | 12/2011 | Pekarek | G06F 17/5077 716/130 |
| 9,093,430 | B2 * | 7/2015 | Chen | H01L 23/481 |
| 2007/0298805 | A1 * | 12/2007 | Basak | H04W 16/18 455/446 |
| 2012/0131534 | A1 * | 5/2012 | Pekarek | G06F 17/5077 716/122 |
| 2012/0191704 | A1 * | 7/2012 | Jones | G06F 3/0484 707/722 |
| 2014/0040794 | A1 * | 2/2014 | Jones | G06F 17/30572 715/763 |
| 2014/0059034 | A1 * | 2/2014 | Wang | G06F 17/30873 707/710 |
| 2015/0045818 | A1 * | 2/2015 | Kim | A61L 31/148 606/151 |
| 2015/0333007 | A1 * | 11/2015 | Chen | H01L 23/481 257/774 |

* cited by examiner

*Primary Examiner* — Stacy Whitmore
(74) *Attorney, Agent, or Firm* — Holland & Knight LLP; Mark H. Whittenberger, Esq.

(57) ABSTRACT

The present disclosure relates to a computer-implemented method for electronic design automation. The method may include providing, using one or more computing devices, an electronic design. The method may further include receiving an indication that a cursor is hovering over an overlap associated with the electronic design and in response to receiving the indication, computing one or more via parameters, based upon, at least in part, a topology associated with the overlap. The method may also include displaying, at a graphical user interface, a potential via and allowing, at the graphical user interface, adjustments to the one or more via parameters.

17 Claims, 12 Drawing Sheets

SYSTEM AND METHOD FOR GENERATING VIAS IN AN ELECTRONIC DESIGN BY AUTOMATICALLY USING A HOVERING CURSOR INDICATION

FIELD OF THE INVENTION

The present disclosure relates to electronic design automation, and more specifically, to a graphical method for visualizing and generating vias in an electronic design.

DISCUSSION OF THE RELATED ART

Electronic design automation (EDA) utilizes software tools that may be used in the design and analysis of numerous electronic systems such as printed circuit boards (PCBs) and integrated circuits (ICs). Verification environments include constraints that describe the relationship between the variables that control the simulation (and sometimes the data that is used as well). For example, in order to verify certain IC designs many simulations are run, which may verify different aspects of the design being tested. Each test may run for a certain amount of design time (usually measured in clock cycles) and a certain amount of user time.

Most electronic designs include vias, which are the electrical connections between layers in a physical electronic circuit that pass through the plane of one or more adjacent layers. The lack of information on how a via is going to be created and the need to interact with a graphical user interface in order to choose between an increasing number of options often results in decreased productivity for EDA designers. For example, based on the technology constraints, the options set and the shapes where the via(s) must be generated, it is almost impossible for the user to anticipate how the via will actually be generated. As such, the only way for the user to verify if a via is correct is to click in the overlap and actually create the via.

SUMMARY

In one or more embodiments of the present disclosure, a computer-implemented method is provided. The method may include providing, using one or more computing devices, an electronic design. The method may further include receiving an indication that a cursor is hovering over an overlap and in response to receiving the indication, computing one or more via parameters, based upon, at least in part, a topology associated with the overlap. The method may also include displaying, at a graphical user interface, a potential via and allowing, at the graphical user interface, adjustments to the one or more via parameters.

One or more of the following features may be included. In some embodiments, the method may include displaying a second potential via, based upon, at least in part, the adjustments to the one or more via parameters. The method may further include receiving a indication to corresponding to via generation, wherein the indication is based upon, at least in part the potential via and upon receiving the indication, generating the via at the graphical user interface. The method may also include displaying one or more icons at the graphical user interface wherein the one or more icons correspond to a pre-set graphical user interface option. The method may further include receiving a selection of the one or more icons at the graphical user interface and upon receiving the selection, generating a display corresponding to the pre-set graphical user interface option.

In some embodiments, a computer-readable storage medium having stored thereon instructions that when executed by a machine result in one or more operations is provided. Operations may include providing, using one or more computing devices, an electronic design. The method may further include receiving an indication that a cursor is hovering over an overlap and in response to receiving the indication, computing one or more via parameters, based upon, at least in part, a topology associated with the overlap. The method may also include displaying, at a graphical user interface, a potential via and allowing, at the graphical user interface, adjustments to the one or more via parameters.

One or more of the following features may be included. In some embodiments, operations may include displaying a second potential via, based upon, at least in part, the adjustments to the one or more via parameters. Operations may further include receiving a indication to corresponding to via generation, wherein the indication is based upon, at least in part the potential via and upon receiving the indication, generating the via at the graphical user interface. Operations may also include displaying one or more icons at the graphical user interface wherein the one or more icons correspond to a pre-set graphical user interface option. Operations may further include receiving a selection of the one or more icons at the graphical user interface and upon receiving the selection, generating a display corresponding to the pre-set graphical user interface option.

In one or more embodiments of the present disclosure, a system is provided. The system may include one or more processors configured to provide an electronic design. The one or more processors may be further configured to receive an indication that a cursor is hovering over an overlap. In response to receiving the indication, the one or more processors may be further configured to compute one or more via parameters, based upon, at least in part, a topology associated with the overlap. The one or more processors may be further configured to display, at a graphical user interface, a potential via. The one or more processors may be further configured to allow, at the graphical user interface, adjustments to the one or more via parameters.

One or more of the following features may be included. In some embodiments, the one or more processors may be further configured to display a second potential via, based upon, at least in part, the adjustments to the one or more via parameters. The one or more processors may be further configured to receive a indication to corresponding to via generation, wherein the indication is based upon, at least in part the potential via and upon receiving the indication, generating the via at the graphical user interface. The one or more processors may be further configured to display one or more icons at the graphical user interface wherein the one or more icons correspond to a pre-set graphical user interface option. The one or more processors may be further configured to receive a selection of the one or more icons at the graphical user interface and upon receiving the selection, generating a display corresponding to the pre-set graphical user interface option.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
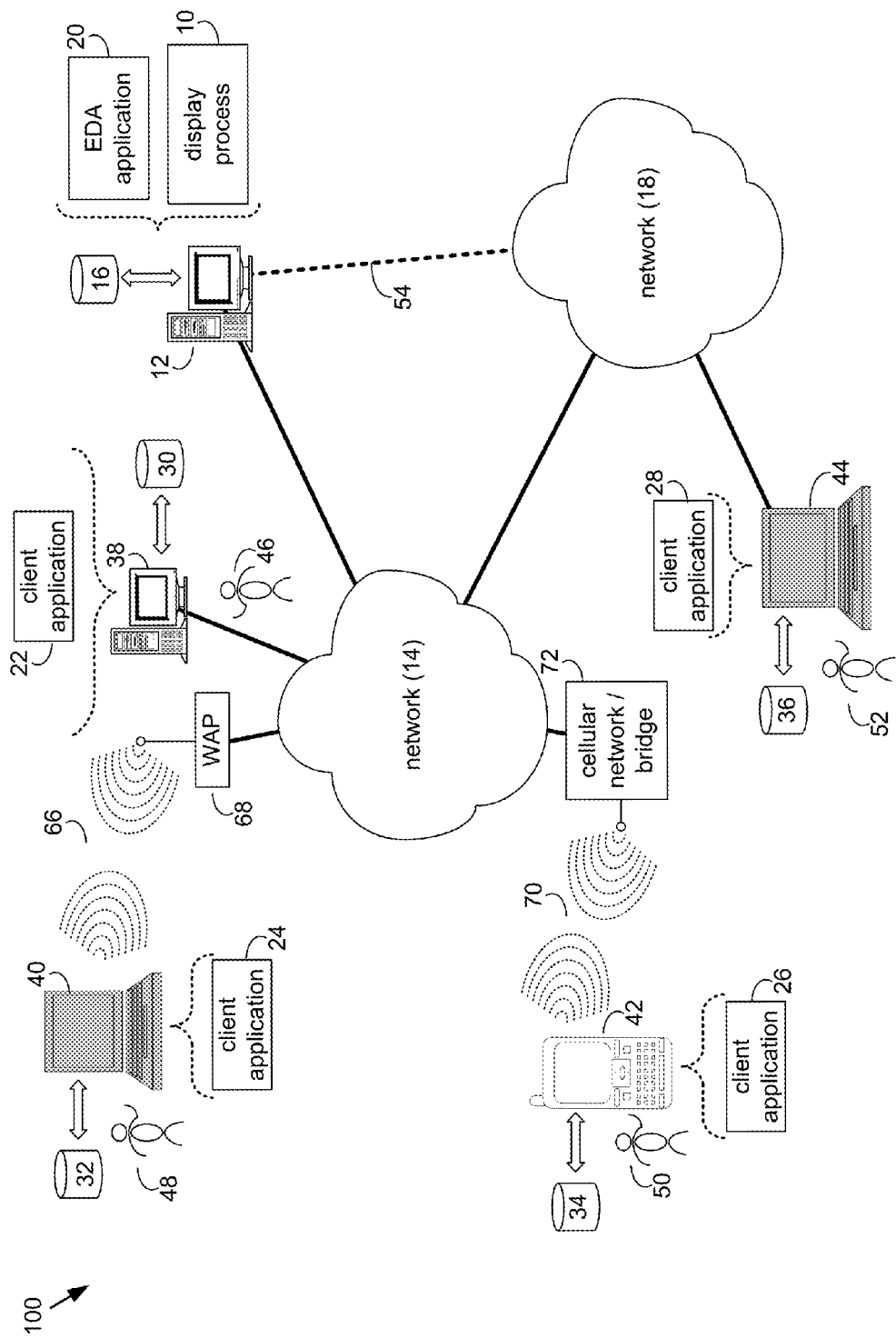
FIG. 1 is a system diagram depicting aspects of the display process in accordance with an embodiment of the present disclosure.

Referring now to FIGS. 1-12, embodiments of the present disclosure relate to a system and method for interactively visualizing and generating vias associated with an electronic design. Accordingly, display process 10 may allow a designer to visualize a possible via prior to its generation and may also allow the designer to alter the parameters of the via prior to via generation. In this way, and as is discussed in further detail hereinbelow, display process 10 may allow the designer to visualize multiple possible via implementations before selecting the desired via for generation.

As used herein, the term "via" may refer to an electrical connection between layers in a physical electronic circuit that may pass through the plane of one or more adjacent layers. In some embodiments, a via may be constructed using a fixed set of predefined via parameters. Some of these parameters may include, but are not limited to, cut width, height, and layer, origin offset, Layer1 and Layer2 enclosures, Implant1 and Implant2 enclosures, Layer1 and Layer2 offsets, cut columns, cut rows, and cut spacing.

As used herein, the term "AutoVia" may generally refer to an interactive command in a circuit layout tool (e.g., those available from the Assignee of the subject application or other electronic design automation companies) to automatically create via(s) between overlapping shapes.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, there is shown an display process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the connection process may reside on and be executed, in whole or in part, by a client electronic device, such as a personal computer, notebook computer, personal digital assistant, or the like.

The instruction sets and subroutines of display process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for report generation. EDA application 20 may be referred to herein as a design tool.

Display process 10 may be a stand alone application, or may be an applet/application/script that may interact with and/or be executed within EDA application 20. In addition/as an alternative to being a server-side process, the display process may be a client-side process (not shown) that may reside on a client electronic device (described below) and may interact with an EDA client application (e.g., one or more of EDA client applications 22, 24, 26, 28). Further, the connection process may be a hybrid server-side/client-side process that may interact with EDA application 20 and an EDA client application (e.g., one or more of client applications 22, 24, 26, 28). As such, the connection process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to:

hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize display process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
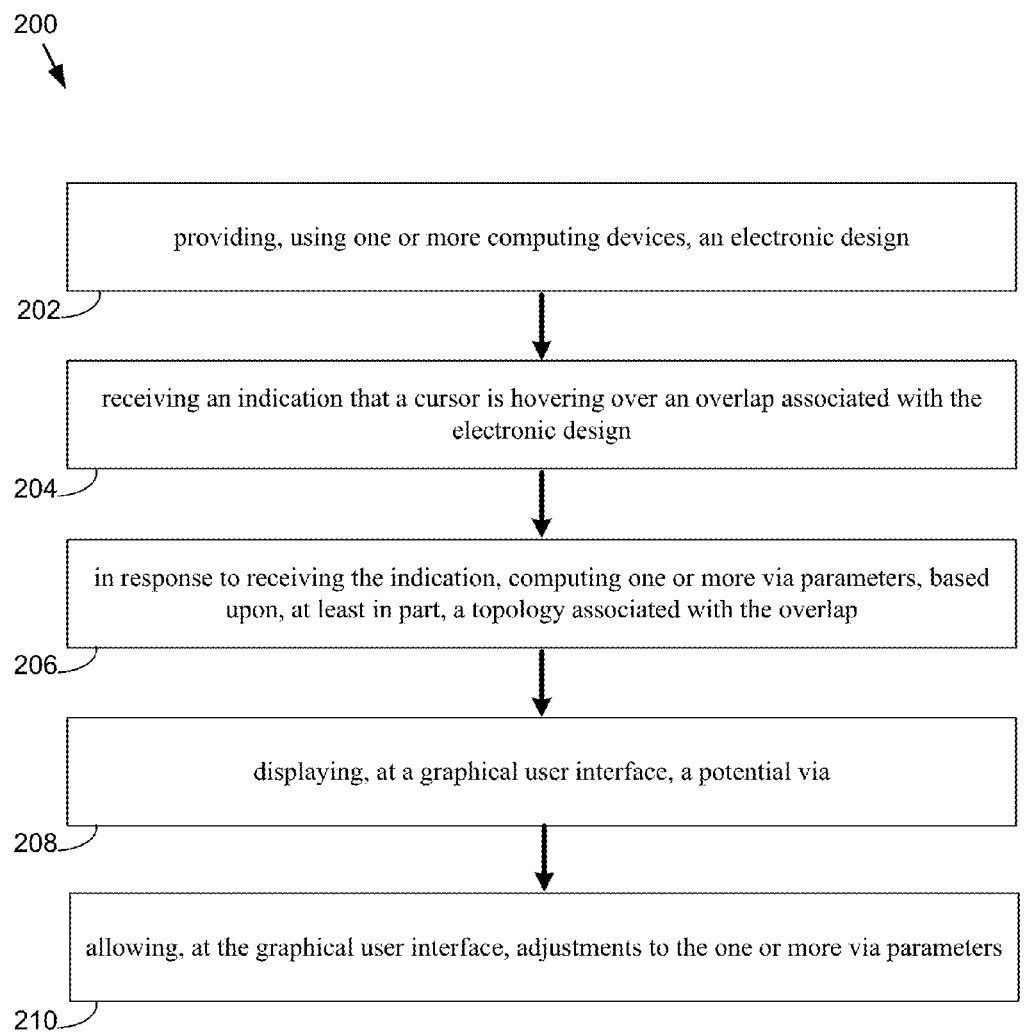
FIG. 2 is a flowchart depicting operations consistent with the display process of the present disclosure.

Referring now to FIG. 2, an embodiment of display process 10 is provided. The process may include providing (202), using one or more computing devices, an electronic design. The method may further include receiving (204) an indication that a cursor is hovering over an overlap associated with the electronic design and in response to receiving the indication, computing (206) one or more via parameters, based upon, at least in part, a topology associated with the overlap. The method may also include displaying (208), at a graphical user interface, a potential via and allowing (210), at the graphical user interface, adjustments to the one or more via parameters.

Figure 3:
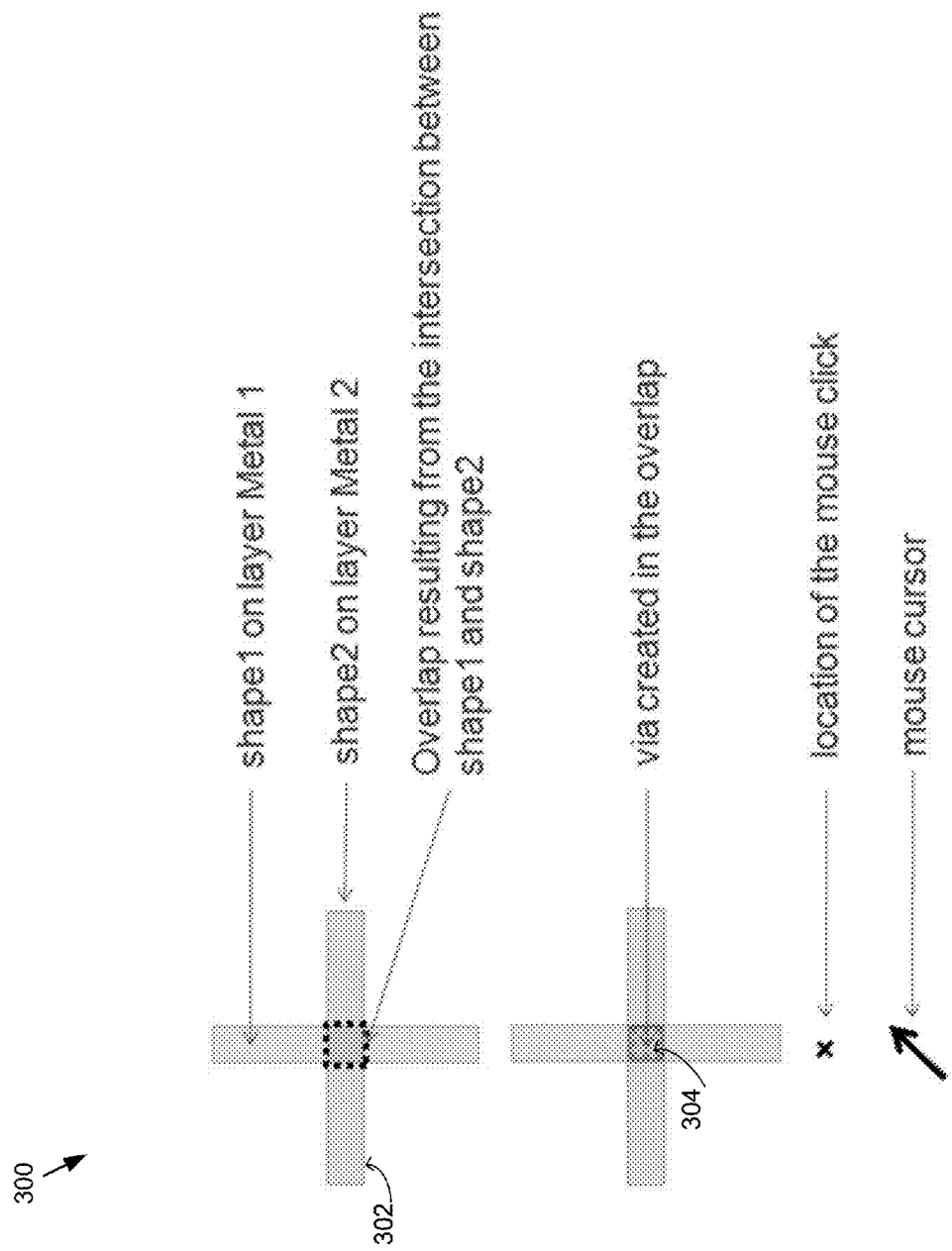
FIG. 3 is a diagram depicting aspects of the display process in accordance with an embodiment of the present disclosure.
Figure 4:
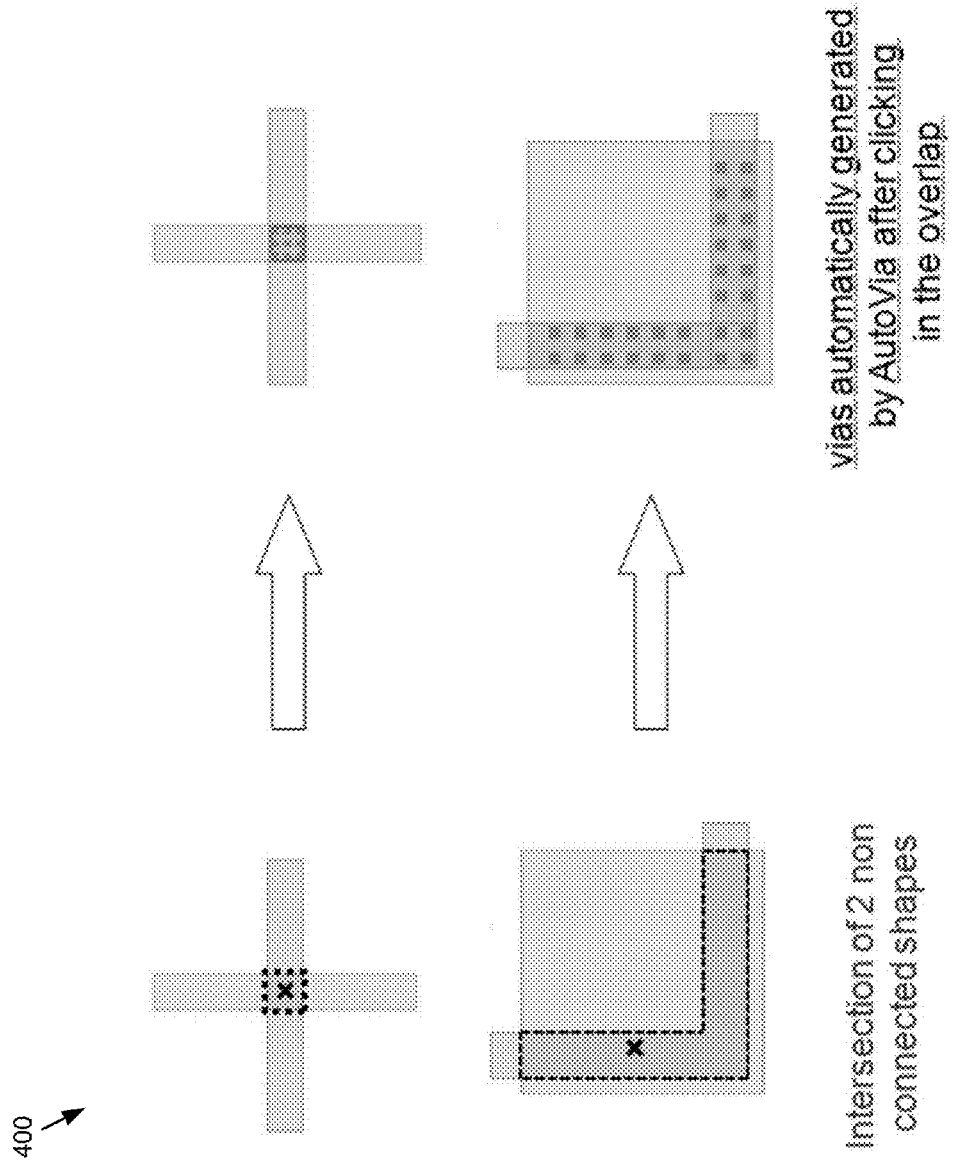
FIG. 4 is a diagram depicting aspects of the display process in accordance with an embodiment of the present disclosure.

Referring also to FIG. 3, a diagram 300 depicting a number of visual definitions consistent with embodiments of display process 10 are provided. For example, diagram 300 shows an image 302 of a first shape on a first layer and a second shape on a second layer as well as the corresponding overlap that may result from the intersection between the first and second shapes. Diagram 300 also includes an example of an image 304 of a via created in the overlap region. Mouse click location indicative of a user selection and the mouse cursor are also shown.

In existing systems, when a user wants to automatically create a via between two non-connected layers he/she may click on the overlap between the two layers and a via may be created based on technology rules. In this case, the user may only see the resulting via after clicking in the overlap. The generated via may depend on user settings available in the AutoVia GUI (see FIG. 10), such as alignment (e.g., auto, centerCenter, lowerLeft, etc.), cut box direction (e.g., auto, horizontal, vertical, etc.), and polygonal overlap fill method (e.g., auto, full, partial, etc.). The "auto" value lets AutoVia choose the best value in the predefined items. Some examples of the AutoVia approach are provided in FIG. 4, wherein the "x" indicates a mouse click location with the automatically generated vias visually displayed after user selection.

According to the technology constraints, the options set in the autoVia form, and the shapes where the via(s) must be generated, it may be difficult for the user to anticipate how the via generated by AutoVia may be implemented. The only way for the user to verify if a via is correct is to click in the overlap and actually create the via.

Accordingly, in order to generate the desired via, the user may have to interact with the AutoVia GUI in order to choose values from predefined lists. For example, a number of alignment choices may be selectable to parameterize how a via has to align according to an overlap. Further, a direction may be selected and an automatic value to parameterize how a polygonal overlap may be filled by multiple vias, the largest via, etc. may also be selected.

Figure 5:
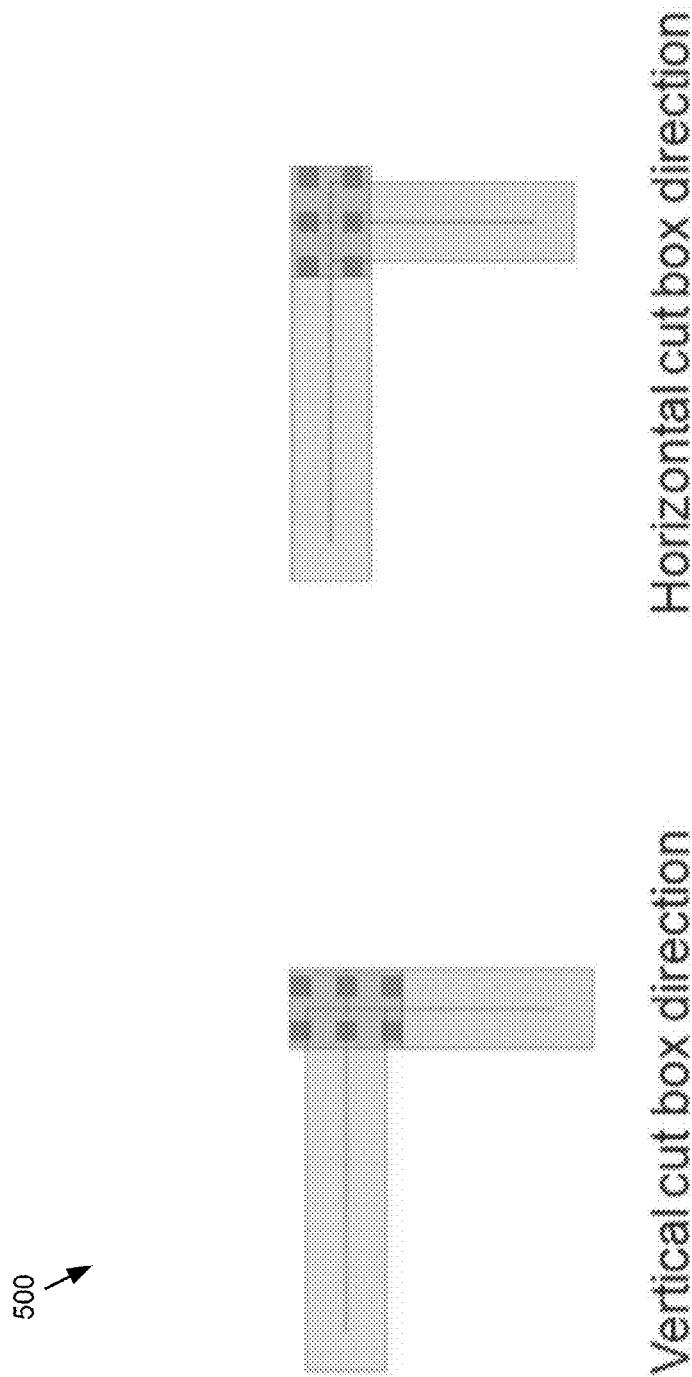
FIG. 5 is a diagram depicting aspects of the display process in accordance with an embodiment of the present disclosure.

Referring now to FIG. 5, an example depicting a diagram 500 showing one particular issue confronted by designers is provided. In this case, the designer may be attempting to determine which via to select for an overlap. Here, the user may want the cut box direction to be driven by a Metal1 shape whereas an alternative approach may involve choosing the cut box direction to be driven by a Metal2 shape. With the cut box direction set to auto in the GUI, it may be difficult for the user to ensure that the created via is generated appropriately.

Figure 6:
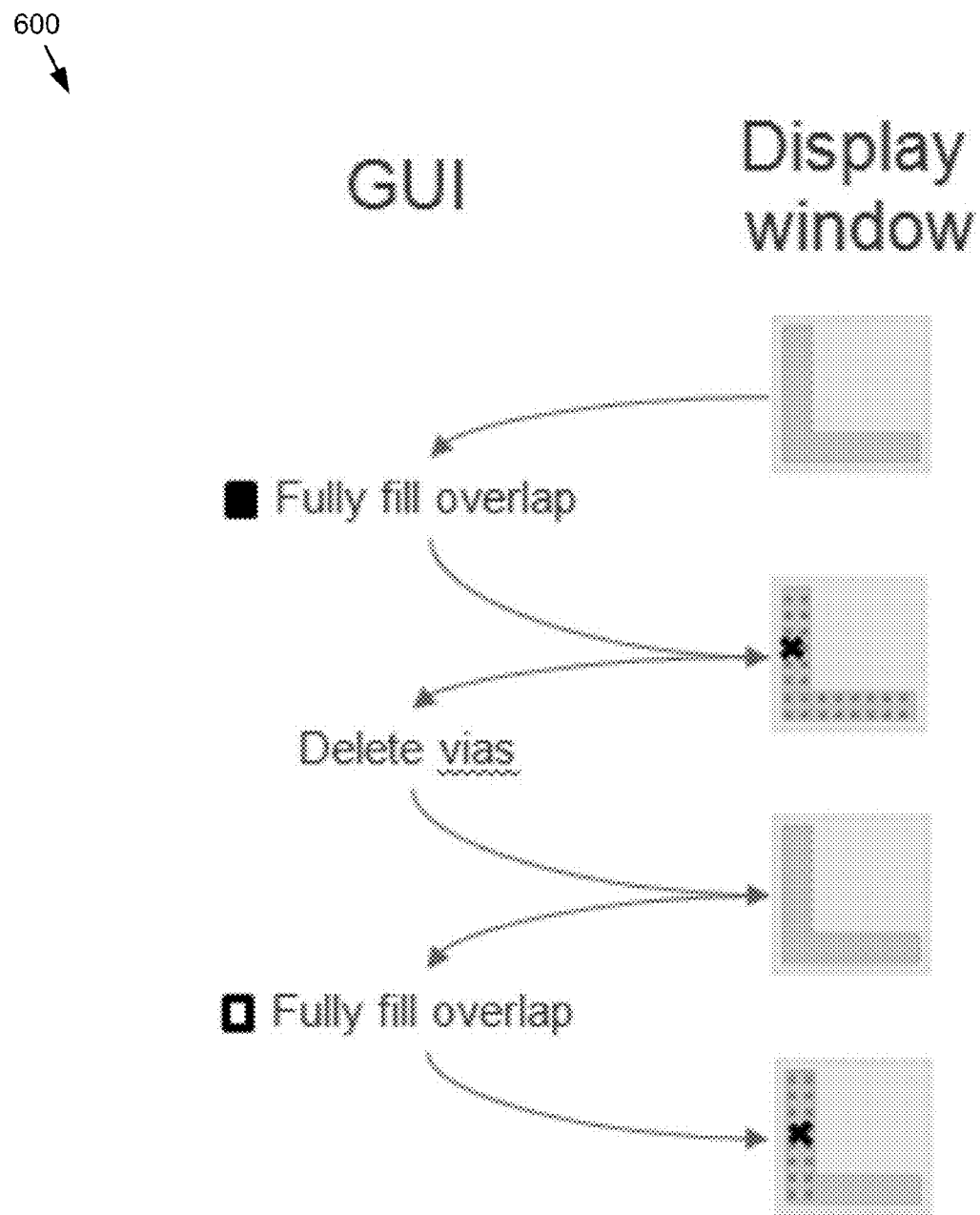
FIG. 6 is a diagram depicting aspects of the display process in accordance with an embodiment of the present disclosure.

Referring also to FIG. 6, an example depicting a diagram 600 showing another issue confronted by designers is provided. In this case, the interaction with a GUI shows the difficult process required in order to validate a solution on a polygonal overlap. From a polygonal overlap the boolean button to fully fill the polygonal overlap may be checked as is shown in FIG. 6. Then a single click in the intersection creates multiple vias to connect intersecting layers. In order to change the via created and to only create the largest rectangle in the overlap the previously created vias must be deleted. Then, the boolean button may be unchecked to create the largest rectangle in the polygonal overlap.

Referring now to FIG. 7-12, embodiments consistent with display process 10 are provided. In some embodiments, and in order to address the problem of determining the appropriate via in an overlap display process 10 may utilize a smart drag of the via as soon as an overlap is hovered. For example, when the mouse cursor hovers (or partially hovers)

over an overlap, the auto via engine may be configured to compute the via parameters based on the overlap topology and the resulting via may be displayed interactively (drag). The GUI may be accessible to change via parameters and the interactive display may be updated on the fly. The final via may be created at the mouse click.

Additionally and/or alternatively, and in order to reduce the user interaction with the autoVia form, embodiments of display process 10 may include one or more smart contextual graphical options. These graphical options are icons linked to some options in form (see FIGS. 10-12, etc.). According to the context (e.g., options set in the form and the shapes where the via must be created) different icons may be displayed on the GUI. Then, when the user moves the mouse cursor on an icon the corresponding option may be changed and the automatic preview may be updated accordingly.

Figure 7:
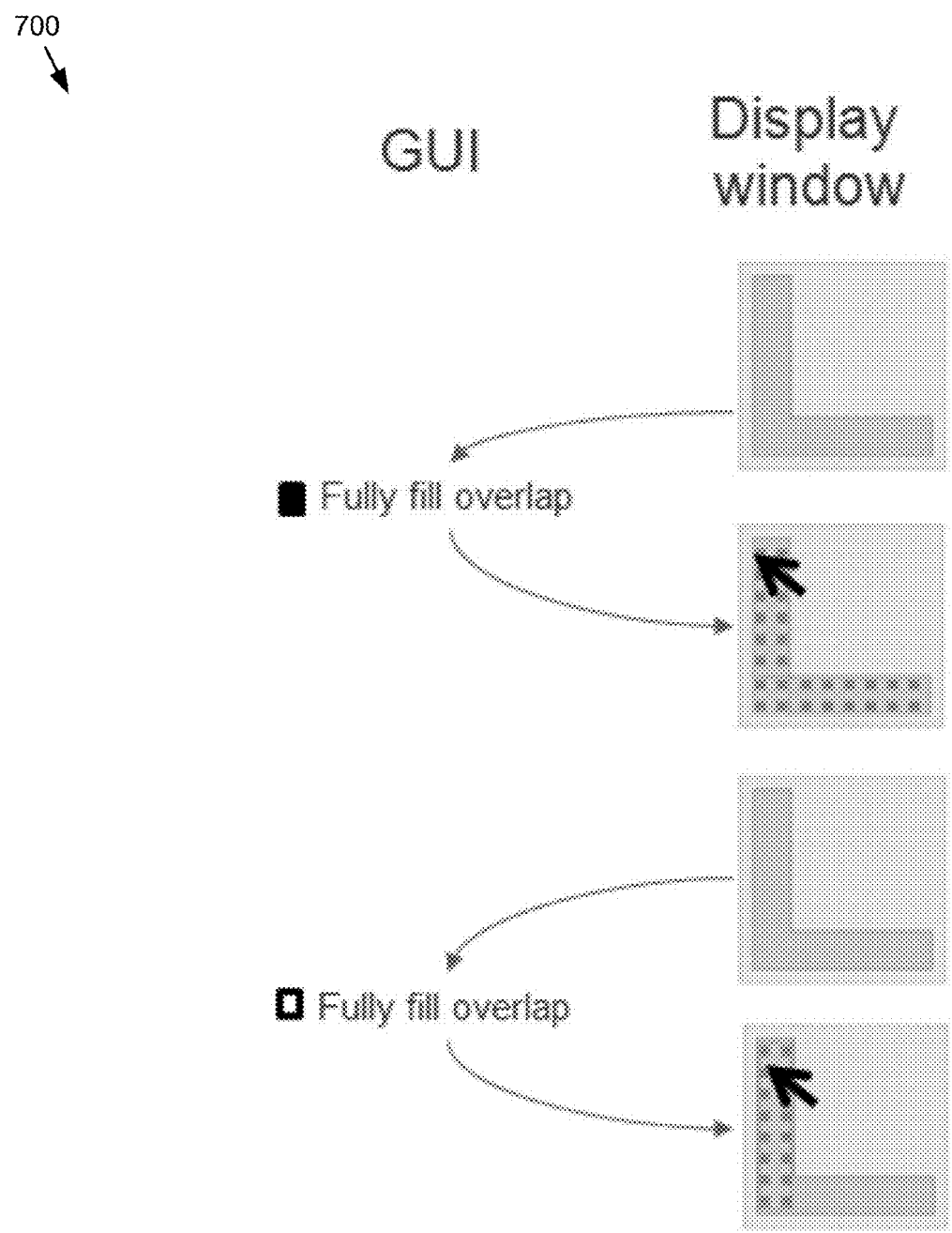
FIG. 7 is a diagram depicting aspects of the display process in accordance with an embodiment of the present disclosure.

As shown in FIG. 7, display process 10 may assist the user in selecting the optimal solution based on its expectations using a smart drag approach. In some embodiments, when starting from a polygonal overlap the overlap polygon filling may be set to Full (e.g. see FIG. 11). When the mouse cursor hovers the overlap then multiple vias may be dynamically displayed. In order to change the via created, and to only create the largest rectangle in the overlap, display process 10 may allow for modification to the overlap polygon filling option in the GUI and to hover again the polygonal overlap at the location where the biggest rectangle has to be created. Embodiments of display process 10 may avoid actually generating the via until a user selection is received (e.g. the final mouse click is selected, etc.). In this case the user has validated a solution before actually selecting it.

Figure 8:
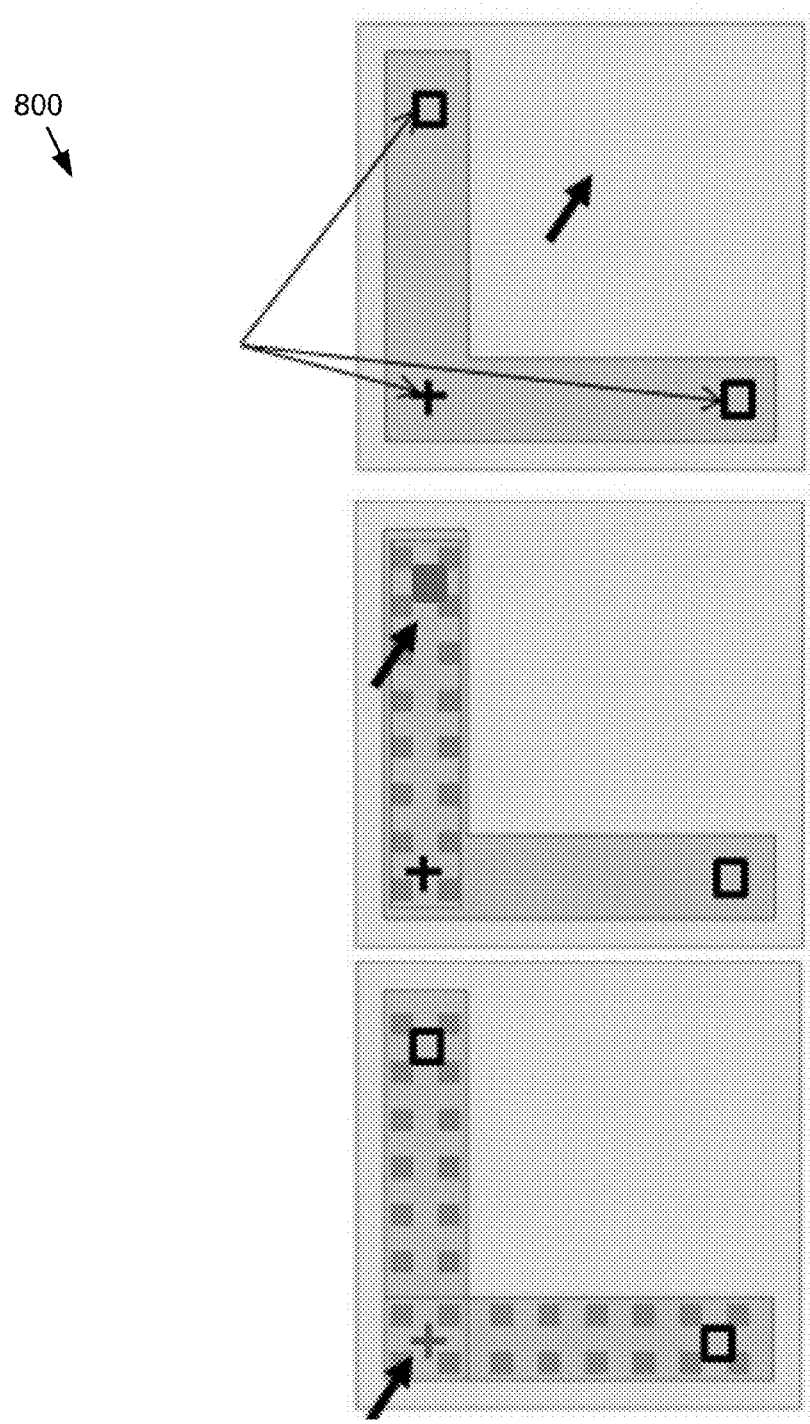
FIG. 8 is a diagram depicting aspects of the display process in accordance with an embodiment of the present disclosure.

Referring now to FIG. 8, in some embodiments, display process 10 may be configured to provide one or more graphical options for polygon filling. Accordingly, in some embodiments display process 10 may allow the user to utilize the mouse cursor (or other suitable technique) to select icons that may be linked to GUI options. Accordingly, the user may not need to interact with the GUI to set options values, as had been previously necessary.

In some embodiments, the icons may indicate the option used to generate largest rectangle or multiple vias in the polygonal overlap. For example, in some embodiments, the square icon may be linked to largest rectangle option, the cross icon may be linked to the multiple vias option, etc. It should be noted that these icons and their corresponding options are provided merely by way of example. Other icons, options and links are also within the scope of the present disclosure.

In operation, when the mouse cursor is moved close to a square icon it indicates that the biggest rectangle may be created in the polygonal overlap. Additionally and/or alternatively, when the mouse cursor is moved close to a cross icon it may indicate that the entire polygon may be filled with vias. In some embodiments, the icon color may change based on the mouse cursor proximity to indicate which value of the option is active.

Figure 9:
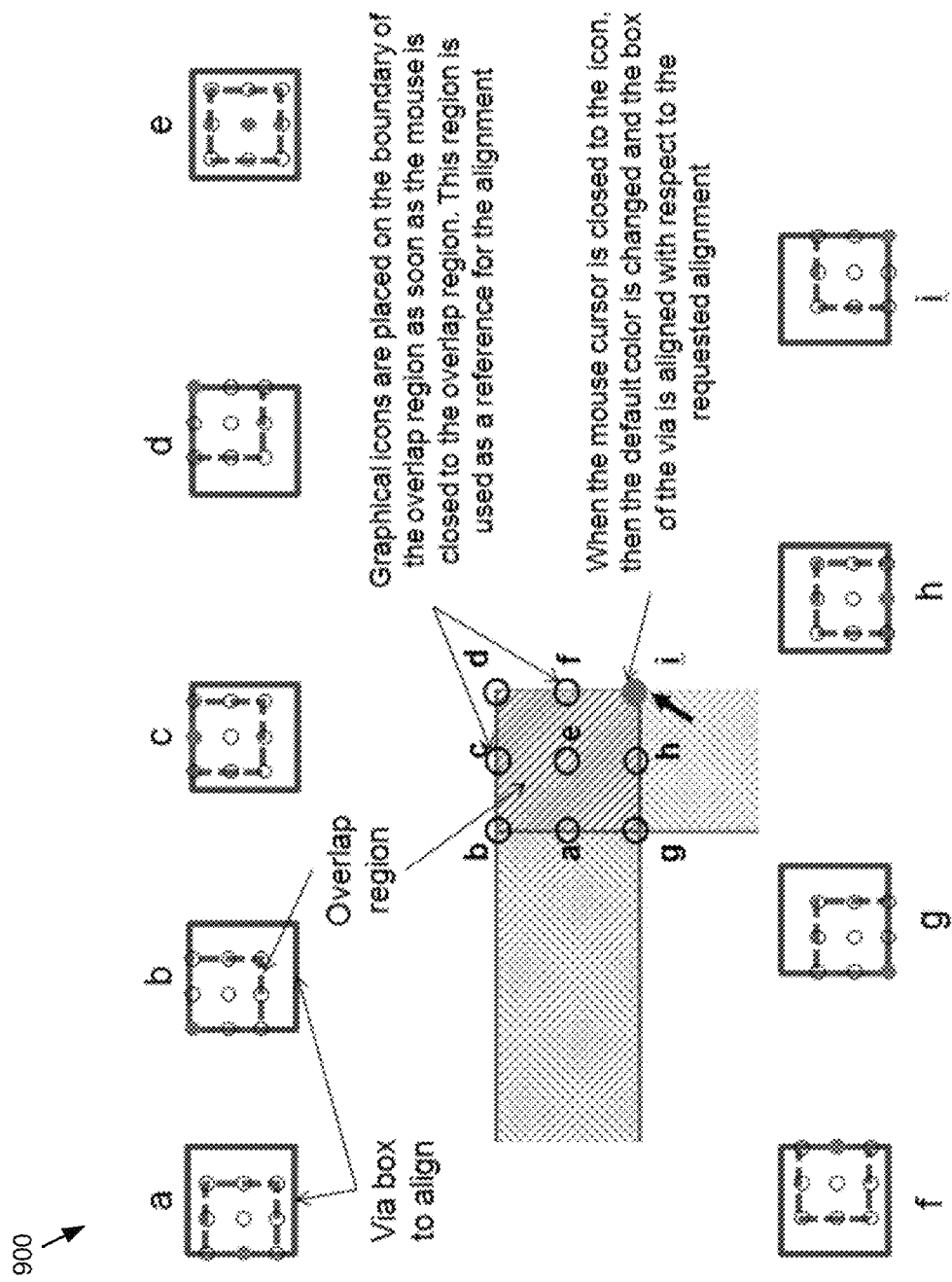
FIG. 9 is a diagram depicting aspects of the display process in accordance with an embodiment of the present disclosure.

Referring also to FIG. 9, an embodiment 900 of display process 10 depicting graphical options for alignment is provided. As is shown in diagram 900, one or more graphical icons (e.g. the circles showing "a-i") may be displayed on the boundary of the overlap region as soon as the mouse is near the overlap region. In some embodiments, this region may be used as a reference point for the alignment. For example, the detailed alignments and positions shown with respect to items a-i in FIG. 9. In operation, when the mouse cursor is near the icon, the default color of the associated circle may be changed and the box of the via may be aligned with respect to the requested alignment.

Figure 10:
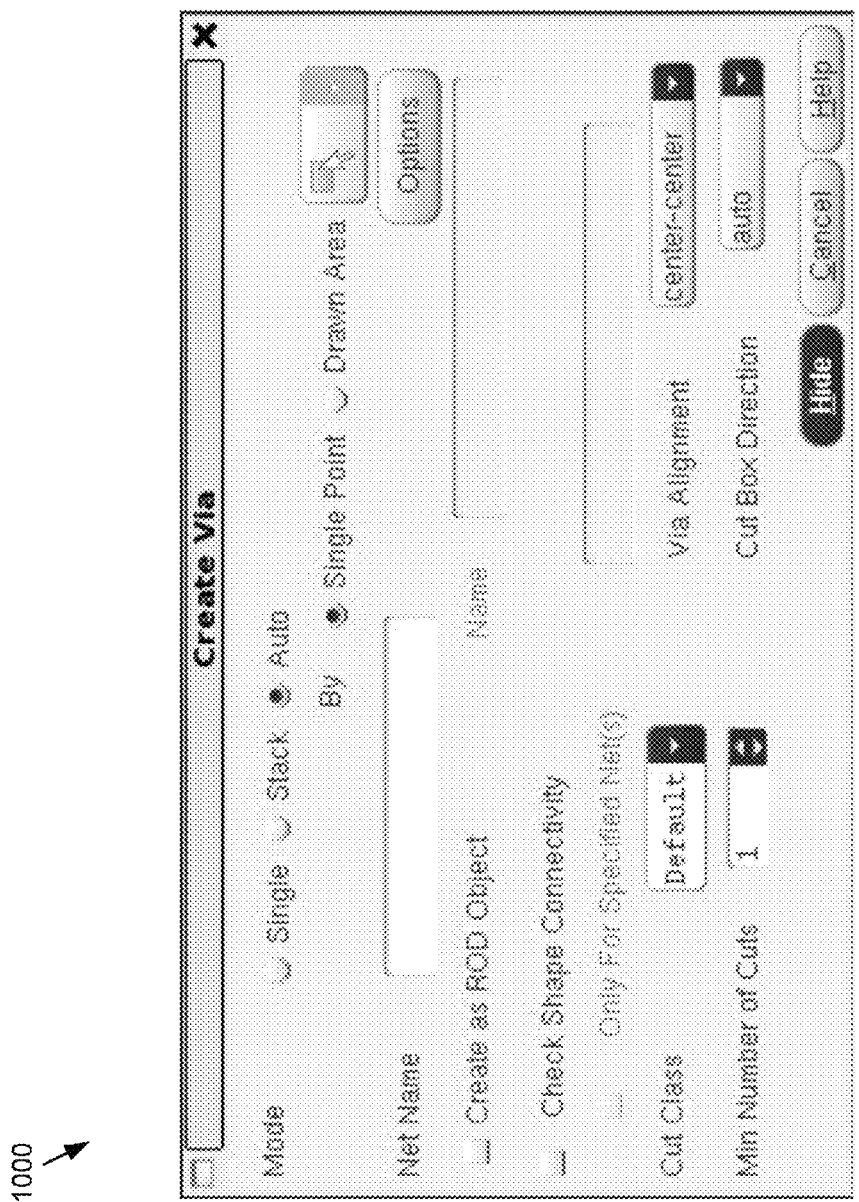
FIG. 10 is a diagram depicting aspects of the display process in accordance with an embodiment of the present disclosure.
Figure 11:
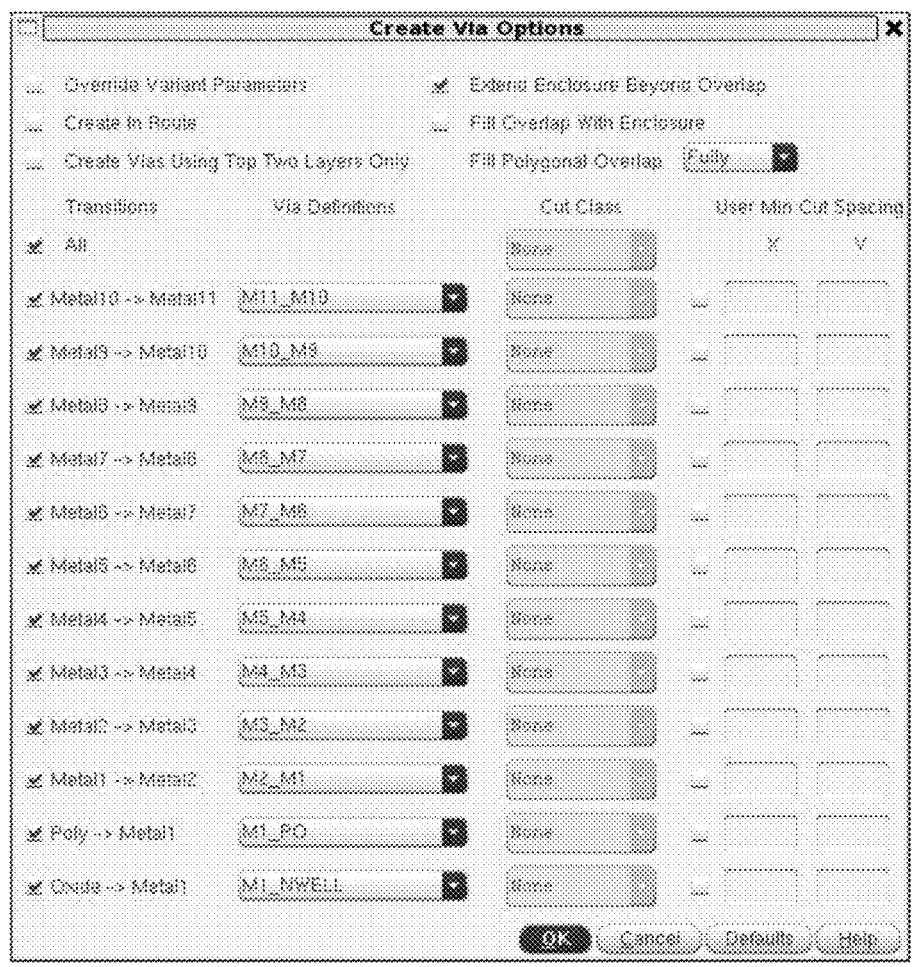
FIG. 11 is a diagram depicting aspects of the display process in accordance with an embodiment of the present disclosure.
Figure 12:
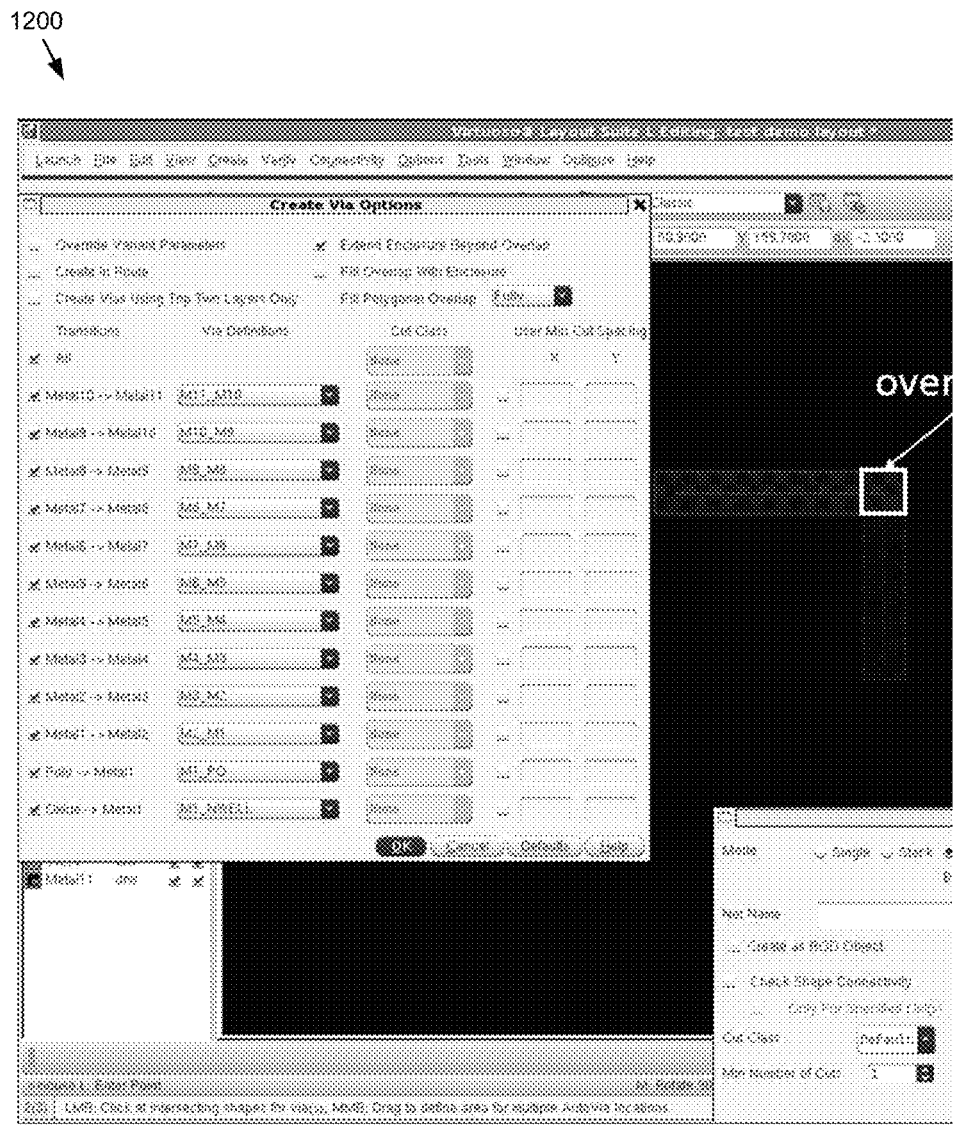
FIG. 12 is a diagram depicting aspects of the display process in accordance with an embodiment of the present disclosure.

Referring now to FIGS. 10-12, a number of graphical user interfaces that may be used in accordance with display process 10 are provided. FIG. 10 depicts an example of an autovia graphical user interface. FIG. 11 depicts an example of an options form that may be used in accordance with display process 10. FIG. 12 depicts an example of an autovia GUI inside of a layout editor GUI. FIGS. 10-12 show the large number of options the user may have to address. For example, FIG. 12 shows that if a customer has to deal with several options then its working area (i.e., the area where he/she designs) may be obstructed by the forms that may need to be opened to modify the options. Embodiments of display process 10 may be used to address these issues.

In some embodiments, display process 10 may be configured to display one or more icons based on the context in the main window. When a user wants to create a via on a given overlap there may be multiple scenarios that need to be addressed. For example, in one scenario, the via may be smaller than the overlap. In this case there may be nothing to display to help the user create the via. In another scenario, the via may be larger than the overlap. In this case, icons may be displayed on the screen. Since icons may be linked to various GUI options, there may be several icons to display. As discussed herein, in this scenario a smart icons priority display may also be performed based on the overlap context. Display process 10 may also provide a link between the preview of the future via to be created and the interactive update with the icons.

Embodiments of display process 10 may drastically improve productivity as the user may be able to validate a solution before explicitly creating any data. In this way, the new smart interactive may be configured to show the user what he or she is going to create. Additionally and/or alternatively, the presence of graphical options may allow the user avoid unnecessary interaction with the form (e.g. needless mouse movement) in order to choose which values to set in several form options in order to obtain the optimal via.

In some embodiments, EDA application 20 and/or display process 10 may support a variety of languages and/or standards. EDA application 20 may support one or more software extensions, which may provide a high-throughput channel between the testbench and the device under test (DUT), and enable automated metric driven verification of embedded software exactly as if it were another part of the DUT.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method in an electronic design comprising:
   providing, using one or more computing devices, an electronic design;
   receiving an indication that a cursor is hovering over an overlap associated with the electronic design;
   in response to receiving the indication, computing one or more via parameters, based upon, at least in part, a topology associated with the overlap;
   displaying, at a graphical user interface, a potential via;
   allowing, at the graphical user interface, adjustments to the one or more via parameters; and
   displaying one or more icons within the overlap at the graphical user interface wherein each of the one or more icons correspond to an associated, pre-set, user-selectable graphical user interface option.

2. The computer-implemented method of claim 1, further comprising:
   displaying a second potential via, based upon, at least in part, the adjustments to the one or more via parameters.

3. The computer-implemented method of claim 1, further comprising:
   receiving an indication corresponding to via generation, wherein the indication is based upon, at least in part the potential via.

4. The computer-implemented method of claim 3, further comprising:
   upon receiving the indication, generating the via at the graphical user interface.

5. The computer-implemented method of claim 1, further comprising:
   receiving a selection of the one or more icons at the graphical user interface.

6. The computer-implemented method of claim 5, further comprising:
   upon receiving the selection, generating a display corresponding to the pre-set graphical user interface option.

7. A computer-readable storage medium having stored thereon instructions that when executed by a machine result in the following operations:
   providing, using one or more computing devices, an electronic design;
   receiving an indication that a cursor is hovering over an overlap associated with the electronic design;
   in response to receiving the indication, computing one or more via parameters, based upon, at least in part, a topology associated with the overlap;
   displaying, at a graphical user interface, a potential via;
   allowing, at the graphical user interface, adjustments to the one or more via parameters; and
   displaying one or more icons within the overlap at the graphical user interface wherein each of the one or more icons correspond to an associated, pre-set, user-selectable graphical user interface option.

8. The computer-readable storage medium of claim 7, further comprising:
   displaying a second potential via, based upon, at least in part, the adjustments to the one or more via parameters.

9. The computer-readable storage medium of claim 7, further comprising:
   receiving an indication corresponding to via generation, wherein the indication is based upon, at least in part the potential via.

10. The computer-readable storage medium of claim 9, further comprising:
    upon receiving the indication, generating the via at the graphical user interface.

11. The computer-readable storage medium of claim 7, further comprising:
    receiving a selection of the one or more icons at the graphical user interface.

12. The computer-readable storage medium of claim 11, further comprising:
    upon receiving the selection, generating a display corresponding to the pre-set graphical user interface option.

13. A system comprising:
    one or more processors configured to provide an electronic design, the one or more processors further configured to receive an indication that a cursor is hovering over an overlap associated with the electronic design, in response to receiving the indication, the one or more processors further configured to compute one or more via parameters, based upon, at least in part, a topology associated with the overlap, the one or more processors further configured to display, at a graphical user interface, a potential via, the one or more processors further configured to allow, at the graphical user interface, adjustments to the one or more via parameters the one or more processors further configured to display one or more icons within the overlap at the graphical user interface wherein each of the one or more icons correspond to an associated, pre-set, user-selectable graphical user interface option.

14. The system of claim 13, further comprising:
    displaying a second potential via, based upon, at least in part, the adjustments to the one or more via parameters.

15. The system of claim 13, further comprising:
    receiving an indication corresponding to via generation, wherein the indication is based upon, at least in part the potential via.

16. The system of claim 15, further comprising:
    upon receiving the indication, generating the via at the graphical user interface.

17. The system of claim 13, further comprising:
    receiving a selection of the one or more icons at the graphical user interface.

* * * * *